United States Patent [19]

Kumakhov

[11] Patent Number: 5,497,008
[45] Date of Patent: Mar. 5, 1996

[54] USE OF A KUMAKHOV LENS IN ANALYTIC INSTRUMENTS

[75] Inventor: Muradin A. Kumakhov, Moscow, U.S.S.R.

[73] Assignee: X-Ray Optical Systems, Inc., Albany, N.Y.

[21] Appl. No.: 383,605

[22] Filed: Feb. 1, 1995

Related U.S. Application Data

[63] Continuation of Ser. No. 259,337, Jun. 13, 1994, abandoned, which is a continuation of Ser. No. 678,437, Apr. 1, 1991, abandoned, which is a continuation-in-part of Ser. No. 678,208, Apr. 1, 1991, Pat. No. 5,192,869, which is a continuation-in-part of Ser. No. 607,456, Oct. 13, 1990, abandoned.

[51] Int. Cl.$^6$ ................................................. G02B 5/124
[52] U.S. Cl. ........................................................... 250/505.1
[58] Field of Search ......................... 250/505.1; 378/34, 378/35; 313/103, 105

[56] References Cited

U.S. PATENT DOCUMENTS

| | | | |
|---|---|---|---|
| 3,821,510 | 6/1974 | Muncheryan | 219/121 L |
| 3,979,621 | 9/1976 | Yates | 313/105 CM |
| 3,979,637 | 9/1976 | Siegmund | 315/12 R |
| 4,266,548 | 5/1981 | Davi | 128/303.1 |
| 4,418,689 | 12/1983 | Kanazawa | 128/6 |
| 4,583,539 | 4/1986 | Karlin et al. | 128/303.1 |
| 4,669,467 | 6/1987 | Willett et al. | 128/303.1 |
| 4,788,975 | 12/1988 | Shturman et al. | 128/303.1 |
| 4,950,939 | 8/1990 | Tosswill | 313/103 CM |
| 4,987,582 | 1/1991 | Webster et al. | 378/85 |
| 5,001,737 | 3/1991 | Lewis et al. | 378/147 |
| 5,016,267 | 5/1991 | Wilkins | 378/85 |

FOREIGN PATENT DOCUMENTS

| | | |
|---|---|---|
| 1803806 | 1/1977 | Germany . |
| 240091 | 10/1986 | Germany . |
| 1227929 | 4/1971 | United Kingdom . |
| 1474955 | 5/1977 | United Kingdom . |
| 8801428 | 2/1988 | WIPO . |

OTHER PUBLICATIONS

M. A. Kumakhov: in *Radiation of Charged Particles In Crystals* (Energoatomizdat, Moscow, 1986) p. 36 [in Russian].

V. A. Arkadjev et al., *Poverkhn. Fiz. Khim. Mekh.* No. 2, pp. 44–47 (1987) [in Russian].

V. A. Arkadjev et al., *Pis'ma Zh; Tekh.* vol. 14, pp. 97–98 (1988) [in Russian].

Abstracts: 3rd Soviet Conf. Radiation of Charged Particles in Crystals (Kabardino–Balkarian Univ. Press, Nalchik, 1988).

F. F. Komarov et al.; pp. 175–176 [in Russian] ibid V. A. Arkadjev et al.; pp. 191–192 [in Russian].

ibid. M. V. Gubarev et al., pp. 195–196 [in Russian].

ibid A. I. Kolomijzev et al.; pp. 199–200 [in Russian; English translation supplied].

ibid V. E. Kovansev et al.; pp. 214–215 [in Russian; English translation supplied].

ibid V. E. Kovansev et al.; pp. 216–217; [in Russian].

V. A. Arkad'ev et al. *Sov. Phys. Usp.*, vol. 32, No. 3, pp. 271–276 (Mar. 1989) [published English translation of *Usp. Fiz. Nauk*, vol. 157, pp. 529–537 (Mar. 1989)].

M. A. Kumakhov & F. F. Komarov; *Physics Reports;* vol. 191, pp. 289–350 (1990) [in English].

*Book of Abstracts: The IV$^{th}$ All–Union Conference on Interaction of Radiation With Solids* (Moscow, 1990).

(List continued on next page.)

Primary Examiner—Jack I. Berman
Assistant Examiner—Kiet T. Nguyen
Attorney, Agent, or Firm—Lieberman & Nowak

[57] ABSTRACT

Analytic instruments using a Kumakhov lens are described. These instruments are useful for X-ray fluorescence analysis or spectroscopy, microscopy, digital subtraction analysis, electron microbeam analysis, X-ray diffraction and neutron diffraction, among others. The analytic instrument provide increased precision and accuracy over instrumentation known in the art. Methods for using these instruments are also taught.

30 Claims, 7 Drawing Sheets

OTHER PUBLICATIONS

D. I. Gruen and M. A. Kumachov, p. 33 [in English].
ibid V. I. Beloglasov et al.; p. 61 [in English].
ibid R. S. Shevelevich et al.; p. 63 [in English].
ibid Yu. I. Dudchick et al.; p. 65 [in English].
ibid Yu. I. Dudchick and F. F. Komarow; p. 67 [in English].
ibid R. P. Jangobegov et al.; p. 70 [in English].
ibid R. P. Jangobegov et al.; p. 73 [in English].
ibid V. A. Arkadiev; p. 85 [in English].
ibid V. A. Arkadiev; pp. 88–89 [in English].
ibid M. A. Kumakhov et al.; p. 91 [in English].
ibid V. V. Beloshitsky et al.; p. 92 [in English].
ibid R. F. Fayazov and M. A. Kumakhow; p. 94 [in English].
ibid S. S. Bukreev et al., p. 99 [in English].
ibid M. V. Gubarev et al.; pp. 173–174 [in English].
ibid M. V. Gubarev et al.; pp. 175–176 [in English].
ibid V. M. Andreevsky et al.; pp. 177–178 [in English].
ibid M. V. Gubanev et al.; pp. 179–180 [in English].
ibid M. V. Gubarev et al.; pp. 181 [in English].
ibid M. V. Gubarev et al.; pp. 182–183 [in English].
ibid M. V. Gubarev et al.; pp. 184–185 [in English].

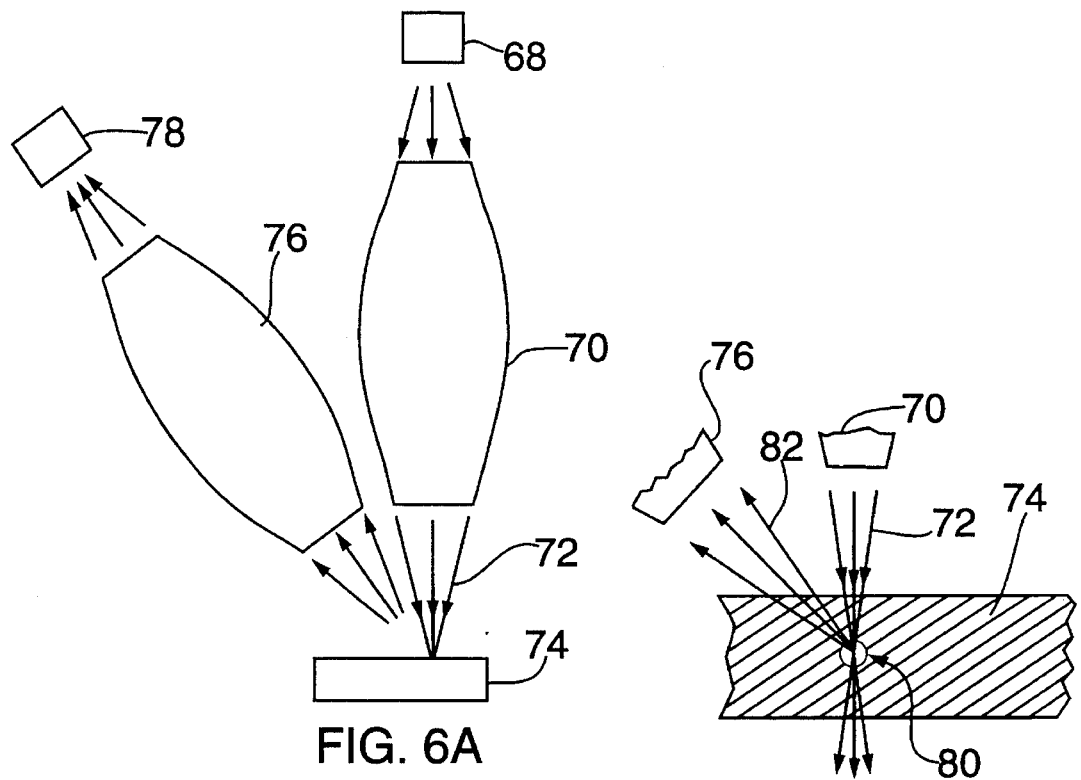
FIG. 6A
FIG. 6B
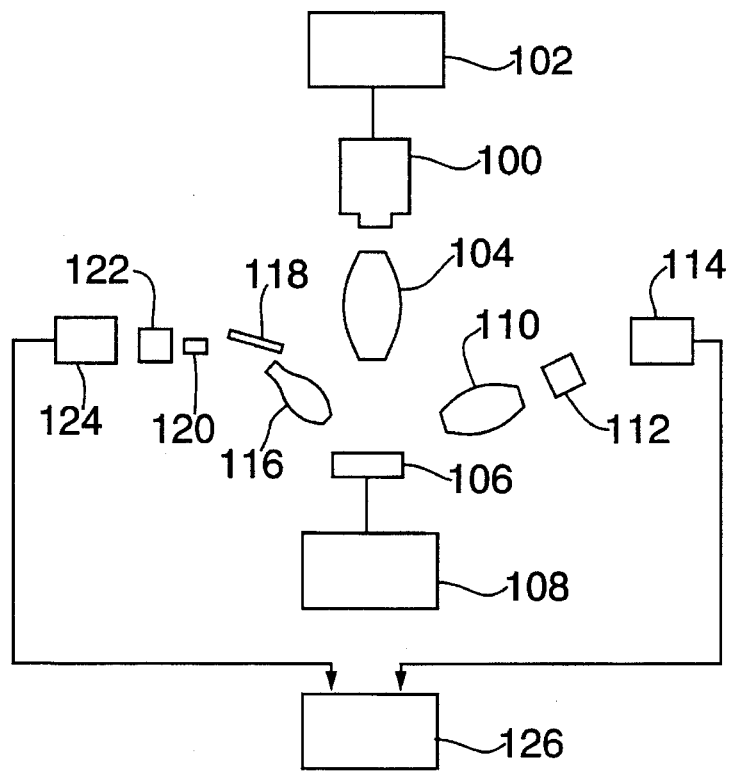
FIG. 7

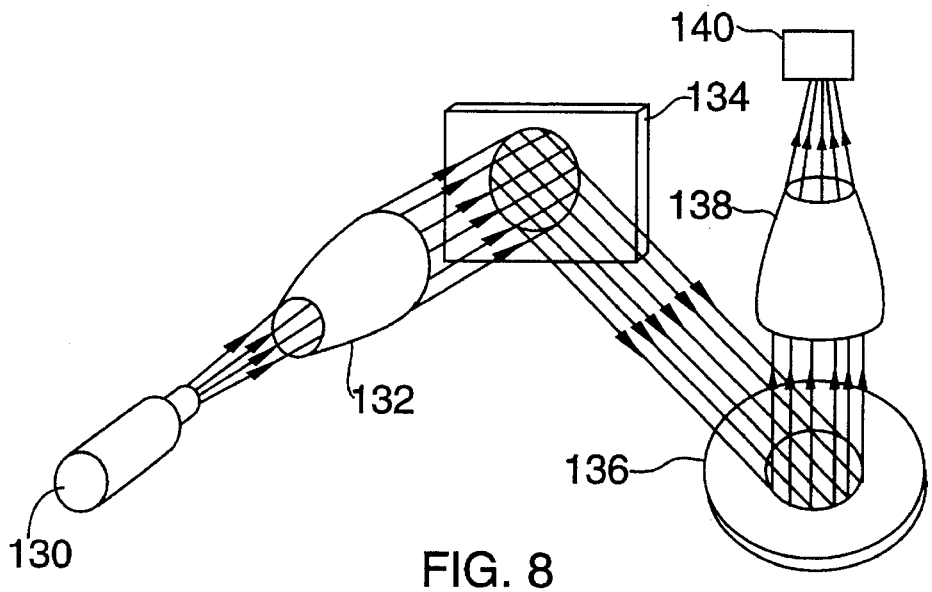
FIG. 8
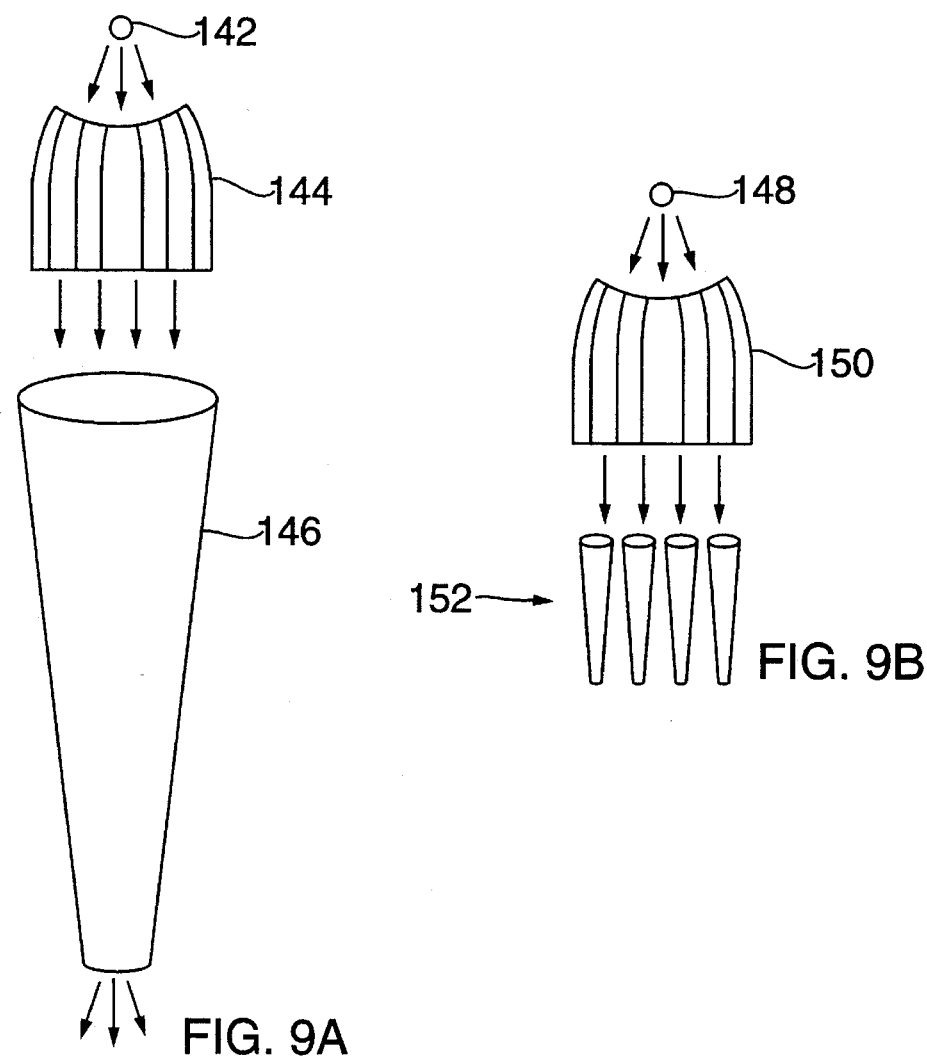
FIG. 9A
FIG. 9B

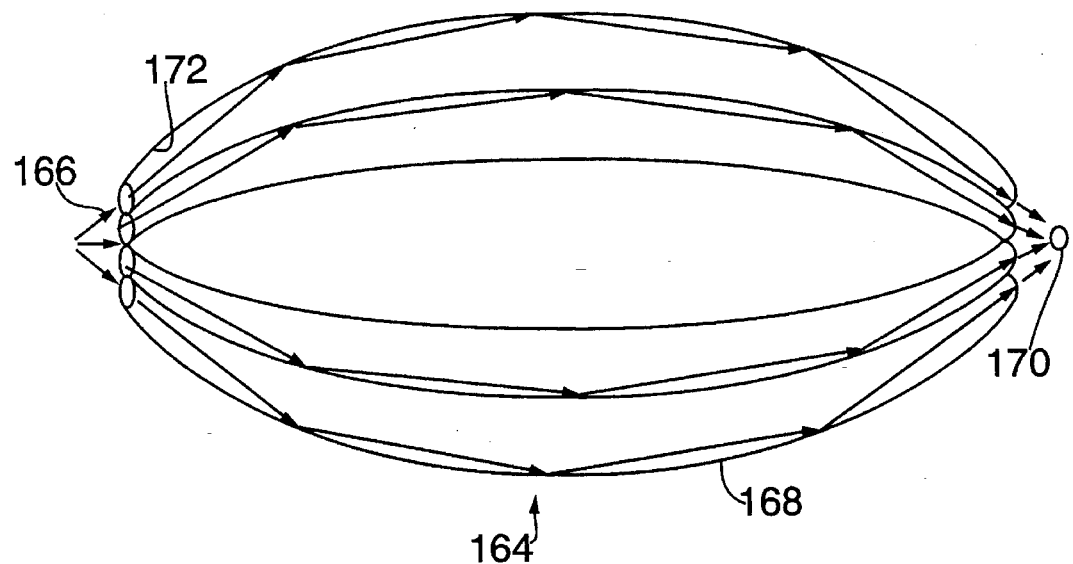
FIG. 12
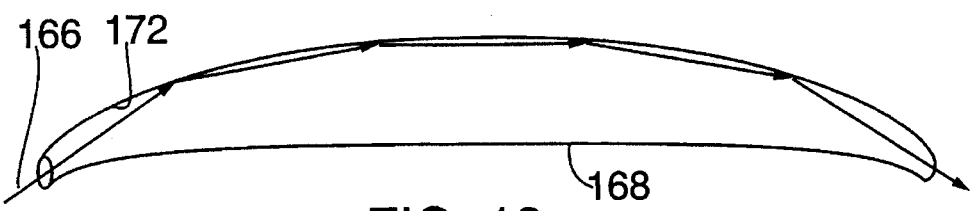
FIG. 13
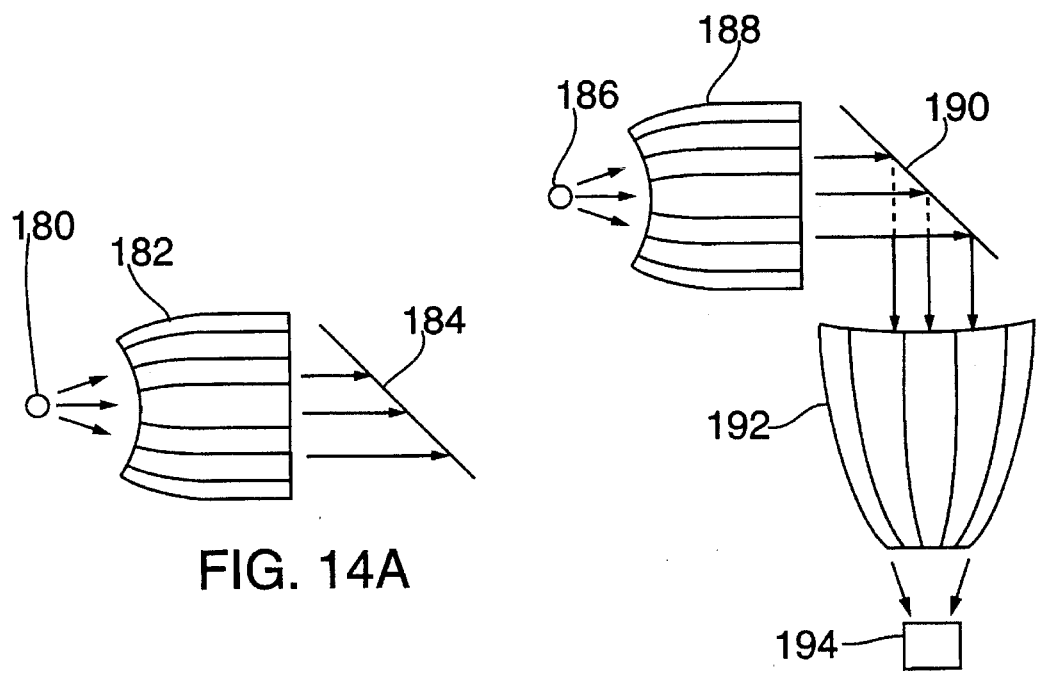
FIG. 14A
FIG. 14B

ID="N" />

USE OF A KUMAKHOV LENS IN ANALYTIC INSTRUMENTS

This application is a continuation of application Ser. No. 08/259,337, filed 13 Jun. 1994, now abandoned, which in turn is a continuation of application Ser. No. 07/678,437, filed 1 Apr. 1991, now abandoned, which in turn is a continuation-in-part of application Ser. No. 678,208, filed 1 Apr. 1991, now U.S. Pat. No. 5,192,869, which in turn is a continuation-in-part of application Ser. No. 607,456, filed 31 Oct. 1990, now abandoned, the contents of application Ser. No. 678,208, filed 1 Apr. 1991, now U.S. Pat. No. 5,192,869, are hereby incorporated by reference.

BACKGROUND OF THE INVENTION

X-rays, gamma rays, and particle radiation are currently used in many types of analytic instruments. By using radiation, much can be learned about the composition, structure, and other characteristics of a sample. Unfortunately, conventional instruments have limited intensity and/or limited control over beam direction or divergence.

One of the most important and widely used nondestructive evaluation methods for a sample (materials, components or systems) is X-ray fluorescence analysis or spectrometry (XRF). This technique uses energetic photons (X-rays) to induce excited electronic states in the atoms of the sample being studied. The atoms are then de-excited by emission of X-rays with an energy equal to the energy difference between the excited state and the ground state of the atom. Such emissions are characteristic of each element. By measuring the spectrum of these secondary X-rays, a quantitative measure of the relative abundance of each elemental species present in the sample can be obtained. This technique is typically fast, nondestructive, quantitative and very sensitive (in many cases parts per million can be detected) and is widely used for separated sample laboratory analysis and real time analysis during manufacture, processing and testing. Because of its quantitative nature and low vulnerability to matrix effects, it is frequently used to calibrate other analytical techniques.

X-ray fluorescence spectrometry, as an analytical tool, has developed primarily along two paths: wavelength dispersive spectrometry (WDXRF) and energy dispersive spectrometry (EDXRF).

Wavelength dispersive fluorescence spectrometry (WDXRF) is older and employs crystal diffraction of X-rays to measure wavelength. Since Bragg diffraction of X-rays is very precise, the wavelength resolution is typically very good, resulting in high sensitivity and, in some cases, determination of the chemical state as well as the amount of sample constituents. Measurements are carried out by using a goniometer which changes the angle of collimated secondary X-rays relative to the planes of an analyzer crystal and a detector which measures the intensity of diffracted X-rays. Because the angular requirements have very tight tolerances, some systems employ two collimators, a primary collimator between the sample and the crystal and a secondary collimator between the crystal and the detector. Although collimation increases resolution, it decreases sensitivity because photons are absorbed by the collimator. Some systems are configured to allow the operator a choice of a range of fine to coarse collimators to adjust the tradeoff between resolution and sensitivity. The strict angular requirements and sequential nature of such a system frequently results in measurement times of minutes or hours to obtain a complete spectrum of wavelengths and therefore composition of the sample. However, if the amount of a particular impurity or constituent is of interest, the goniometer can be set at the proper position and the measurement can be made in a shorter time. Alternatively, a number of monochromators, each containing a crystal and detector set to measure wavelength for a particular element can be used to simultaneously determine the relative amount of a number of elements. Furthermore, crystals can be bent to allow a range of incident angles to be diffracted, thereby relaxing the collimation conditions. This is frequently done for process control measurements.

Energy dispersive fluorescence analysis (EDXRF) measures the energy spectrum of secondary X-rays, typically with a semiconductor silicon or germanium detector. An incident X-ray photon stops in the detector by exciting electrons from the conduction to the valence band of the semiconductor. The resulting electron-hole pairs are swept apart in the electric field applied across the semiconductor diode and the number is proportional to the photon energy. By sorting the charge pulses in a multichannel analyzer, the entire energy spectrum of incident X-rays can be determined. This detection method has inherently poorer resolution (determined by the electronic resolution of the detector-electronic system and ultimately by the statistics of the photon slowing down process), and is frequently limited by the high counting rate in the detector of photons other than those of interest. In spite of these limitations, simplicity, lower cost, and the convenience of getting the entire spectrum at one time, frequently makes EDXRF the technique of choice. The two described measurement techniques may be combined to get rapid, semi-quantitative results followed by high resolution measurements, although few commercial instruments can accomplish this.

X-rays produced by photon bombardment of solid targets include monoenergetic X-rays characteristic of the target material on a broad background of "bremstrahlung" radiation. Secondary X-ray spectra excited by such an X-ray source usually has a background especially at lower energies from scattering of the bremstrahlung continuum radiation in the sample. Characteristic X-ray production from a particular element is most efficient when the exciting X-rays are just above the absorption edge energies of the element of interest. Both background reduction and increased efficiency requirements can be met by using a "secondary target excitation" approach in which the primary X-rays are incident on a target composed of selected element(s) to give nonenergetic X-rays of appropriate energy for excitation of the sample. These techniques together with the use of selected filters between the primary and secondary source is called Source Tuned X-Ray Fluorescence, or STXRF. Because the X-ray intensity is very much reduced from a secondary target, this technique has been used principally with EDXRF, although the same benefits should be realized in WDXRF measurements.

The subject invention provides a solution to the long felt need in the art for improved X-ray fluorescence analysis by (1) decreasing measurement time due to increased intensity reaching the detector, (2) decreasing measurement time due to decrease in bremstrahlung radiation reaching the detector causing photon pile-up, (3) increasing resolution by increasing signal to noise ratio, (4) decreasing the bremstrahlung radiation reaching the detector, (5) increasing resolution for WDXRF by very precise control of angular relationships, (6) improving ability to evaluate small well defined areas, (7) improving ability to determine the distribution of constituents by scanning, (8) improving ability to determine average composition over a well defined area without moving the sample, source aperture, or any other part, (9) allowing analysis of well defined interior volumes in a solid, and (10) reducing the cost of other components in system, such as by allowing the use of smaller detectors.

X-rays optics encounter difficulties different from those in the visible and IR ranges. These difficulties stem from the fact that the surfaces of all known materials have very low reflection coefficients for radiation at large angles of incidence. One way to overcome this problem is by using grazing incidence to take advantage of the total external reflection of X-rays. This is done in X-ray telescopes and microscopes and in mirrors used in synchrotrons for deflection and focusing. Such applications operate on the basis of one or two reflections and have an extremely small angular aperture because of the small value of the total-external-reflection angle (about $10^{-3}$ radians). On the other hand, diffraction and interference elements such as Bragg and multiple layer mirrors, zone and phase plates, and gratings are very wave length selective and therefore cannot be used to control X-ray beams having a wide energy distribution.

The inventor of the subject invention first proposed focusing X-rays by multiple reflections from surfaces with certain special shapes and carried out systematic investigations of this suggestion demonstrating that transmission through these "Kumakhov" lenses could be as high as 50%. Moreover, even with lower transmission, an increase in X-ray intensity (as great as four orders of magnitude) is obtained due to the large collection angular aperture possible (0.25 rad).

SUMMARY OF THE INVENTION

The subject invention provides an analytic instrument comprising a Kumakhov lens. Typically, the Kumakhov lens is located between a radiation source and a sample to be analyzed. The subject instrument maybe an X-ray device, such as an X-ray fluorescence device, X-ray microscope or X-ray diffraction device, an ionic device, such as an ion microscope, a neutron device, such as a neutron microscope or neutron diffraction device, or an electron beam device.

Most often the subject instruments comprise a monochromater in which the radiation source is capable of transversing both the Kumakhov lens and the monochromater. In this application, the Kumakhov lens is usually a divergent beam concentrator, parallel beam concentrator, quasi-parallel beam former, or quasi-parallel beam manipulator.

Another embodiment of the subject invention is where the Kumakhov lens is positioned between a secondary radiation source and a sample, with the Kumakhov lens typically functioning as a divergent beam concentrator, parallel beam concentrator, quasi-parallel beam former, or quasi-parallel beam manipulator.

The subject invention also provides for a Kumakhov lens being positioned between a sample to be analyzed and a means for detecting radiation with the Kumakhov lens typically functioning as a divergent beam concentrator, parallel beam concentrator, quasi-parallel beam former, or quasi-parallel beam manipulator.

A Kumakhov lens may function as a band-pass filter. Moreover, the subject instruments are suitable for use in digital subtraction analysis. In summary, the subject invention teaches the use of a Kumakhov lens in an analytic instrument.

The subject invention also provides a method for analyzing a sample, which comprises providing a source of radiation; directing the radiation produced by the source through a Kumakhov lens; contacting the sample to be analyzed with the radiation exiting the Kumakhov lens; and detecting the radiation exiting the sample.

Typically, the radiation detected is then correlated with known parameters of such radiation.

The directing of radiation from the source may further comprise reflecting the radiation exiting the Kumakhov lens and passing the reflected radiation through a second Kumakhov lens. This usually is accomplished by using a crystal and may utilize a single crystal monochromater. Further, the radiation exiting the sample may be passed through a second Kumakhov lens prior to detection.

BRIEF DESCRIPTION OF THE FIGURES

FIG. 6A: A schematic representation of system having an X-ray source, first Kumakhov lens, sample, second Kumakhov lens and detector. X-rays travel from the source through the first Kumakhov lens to the sample where it is deflected through the second Kumakhov lens to the detector.

FIG. 6B: A schematic representation of the sample (as shown in FIG. 6A: with some of the X-rays being deflected to the second Kumakhov lens and other X-rays passing through the sample.

FIG. 7: A schematic representation of a complex analytical system having a source power supply, an X-ray source, Kumakhov lens, sample, sample positioning system, energy dispersive detectors, single crystal or multi-layer reflector, detector electronics, and computer control and analysis system.

FIG. 8: A schematic representation of a system having an X-ray source, Kumakhov lens, single crystal monochromator, sample, Kumakhov lens, and detector.

FIG. 9A: A schematic representation of a source, Kumakhov lens, and capillaries.

FIG. 9B: A schematic representation of a source, Kumakhov lens, and multiple capillaries.

FIG. 12: A schematic representation of a lens mode of barrel-shaped capillaries.

FIG. 13: A schematic representation of a trajectory of photons through a barrel-shaped capillary.

FIG. 14A: A schematic representation of diffraction by using a source, Kumakhov lens and a crystal.

FIG. 14B: A schematic representation of a differentiation using a source, a first Kumakhov lens, crystal, second Kumakhov lens and detector.

DETAILED DESCRIPTION OF THE INVENTION

Kumakhov lenses utilize the specular reflection of X-rays from smooth surfaces for incidence angles smaller than the critical external reflection (CER) angle (of the order of $10^{-3}$ radians, depending on the wave length). Closely spaced multiple surfaces act as a waveguide for the X-rays.

Most Kumakhov lenses comprise a large number of curved hollow capillaries. The transmission properties of the lenses depend critically on the design, including the internal diameter and the curvature of the capillaries. Lenses having capillary diameters of 200–400 microns are suitable for transmission of X-rays in the energy range of about 500 eV to 10 Kev, i.e. lower than that needed for many XRF applications. Moreover, they provide a good test of the theoretical and design calculations. Kumakhov lenses are not limited to hollow capillaries and their method of construction includes, but is not limited to, reflecting surfaces which are linear or curved in cross-section with vacuum or low density gas between the surfaces. Multilayer structures with alternating layers of high and low density material in a variety of shapes can also be used for high energy photons.

Figure 1:
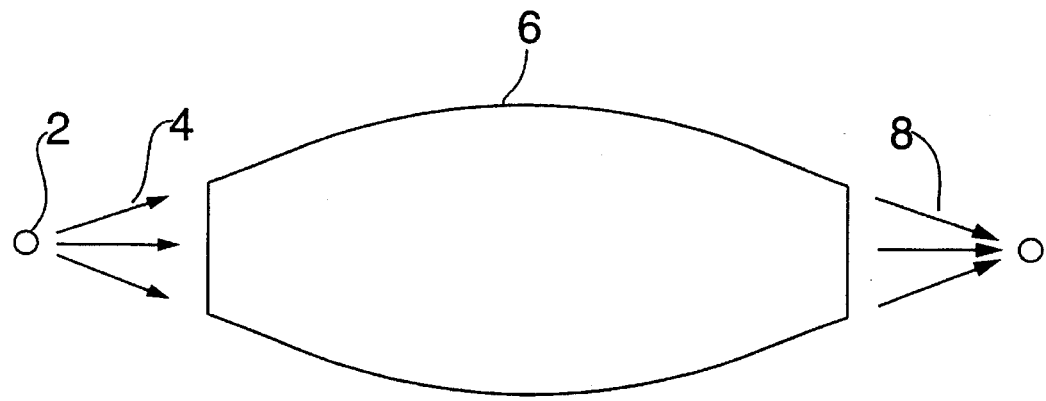
FIG. 1: A schematic representation of a divergent beam concentrating Kumakhov lens.

Kumakhov lenses can be subdivided into three types:

1. Divergent-beam concentrators 6 (FIG. 1). Devices of this type make it possible to collect radiation 4 from a divergent X-ray source 2 over an angular aperture of several tens of degrees and to focus it into a convergent beam 8. If desired, the beam 8 can be focused into a very small spot (even less than 100 micron in diameter) depending on radiation energy and lens design.

Figure 2:
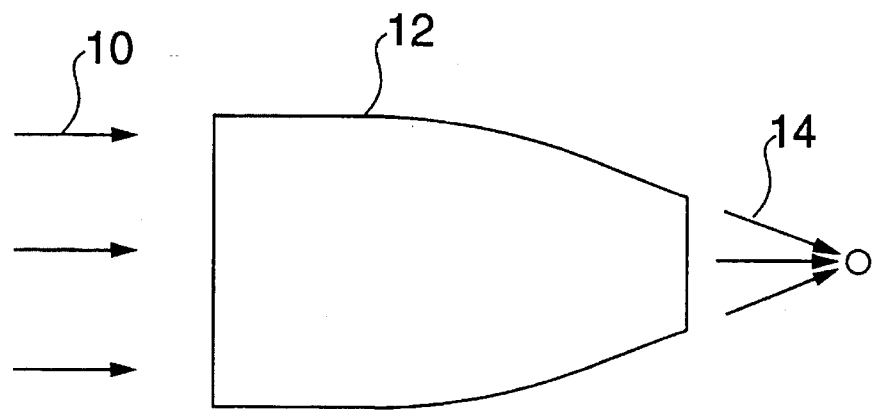
FIG. 2: A schematic representation of a parallel beam concentrating Kumakhov lens.

2. Parallel-beam concentrators 12 (FIG. 2). Such devices concentrate a parallel X-ray beam 10 into a convergent beam 14.

Figure 3A:
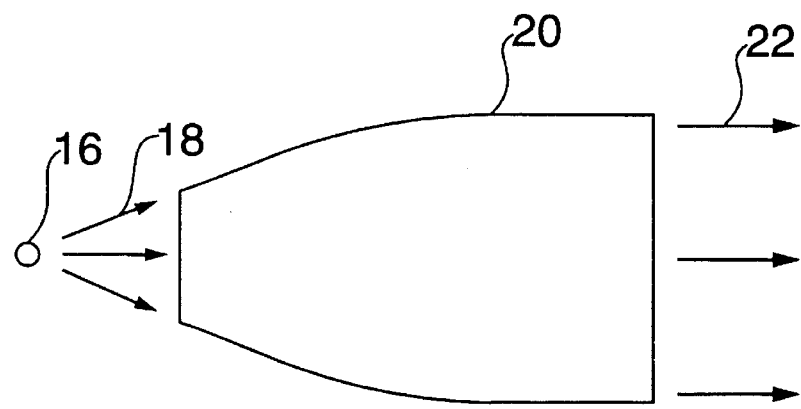
FIG. 3A: A schematic representation of a quasi-parallel beam forming Kumakhov lens.
Figure 3B:
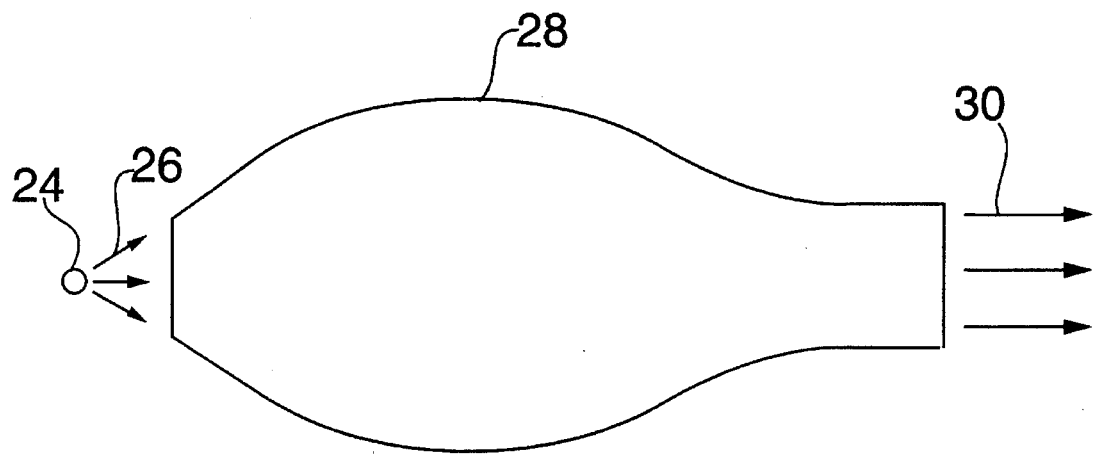
FIG. 3B: A second schematic representation of a quasi-parallel beam forming Kumakhov lens.

3. Quasi-parallel-beam formers 20 (FIG. 3). A divergent beam 18 from a source 16 is converted into a quasi-parallel beam 22. In most of the lenses made to date, divergence is equal to approximately ½ the critical angle for total external reflection, although in principle, the divergence can be decreased to less than $10^{-4}$ radians by special lens design. A quasi-parallel-beam former can have a simple shape with only one direction of curvature along the longitudinal surface of a channel, essentially half a divergent-beam former (FIG. 3A). Quasi-parallel-beam formers can also have a compound curve 28 which converts a divergent beam 26 from a source 24 into results in a quasi-parallel beam 30 concentrated in a smaller area (FIG. 3B).

Other shapes are suitable for special applications, including but not limited to, divergent beam concentrators with compound curves to obtain longer focal length and lenses designed to change the direction of a beam or split a beam, sometimes while performing functions mentioned above.

The preferred embodiment has a circular cross section. However, flat, square, rectangular, or have any cross section may be utilized.

X-Ray Fluorescence

Many of the principles and devices described will enable an individual skilled in the art to apply these teachings to other instruments and to better understand the devices and methods described hereinafter.

X-ray fluorescence (XRF) measures X-rays emitted by a sample to non-destructively obtain a quantitative measure of the relative abundance of elements. By incorporating Kumakhov lenses into XRF devices, performance is significantly enhanced. A Kumakhov lens can be used with X-rays to obtain a larger collection angle, collimate, render beams parallel, reduce background X-rays, cause beams to converge, and collect from well defined small areas. Use of Kumakhov lenses with XRF devices improves performance (e.g., improving sensitivity, decreasing measurement time, relaxing the specification for other components such as sources, collimators, and detectors, thereby reducing their cost, improving spatial resolution, and enabling entirely new capabilities such as non-contact XRF analysis on interior points within the sample).

Kumakhov lenses utilized in XRF analysis in three different forms: 1) collection and focusing of X-rays incident on the sample; 2) collection and focusing of secondary X-rays emitted by the sample; and 3) both.

Figure 4:
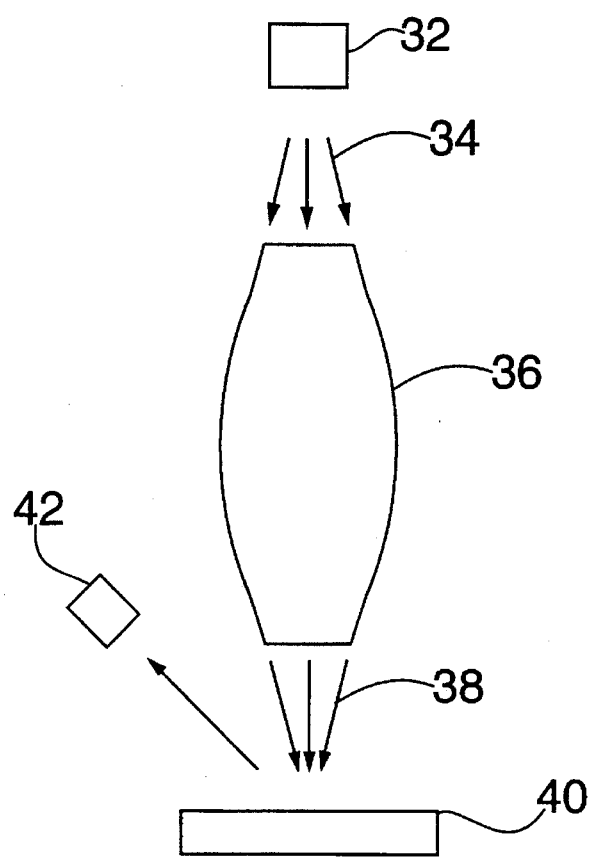
FIG. 4: A schematic representation an X-ray source, a Kumakhov lens, a sample and detector. X-rays travel from the source, through the lens and to the sample where they are deflected and then detected.

FIG. 4 shows a lens 36 on the source side of the sample 40 focusing X-rays 34 from a source 32 into an incident X-ray beam 38 projected onto the sample 40, which emits X-rays detected by detector 42. The arrangement of FIG. 4 provides a large increase in intensity and spatial resolution for localized or area analysis compared with collimators currently in use. For example, at least a factor of 200 increase in intensity with a spatial resolution of up to 30 microns (0.03 mm) compared to a commercial EDXRF system which has spatial resolution of 0.25×1.25 mm² is possible. This takes into account the fact that without the lens, the source is closer to the sample. In addition to giving higher intensity and smaller spot size, the implementation of a Kumakhov lens provides more open space around the sample and avoids the blocking effects and background problems arising from secondary X-rays emitted from collimators. If the X-ray source is not a primary source as in Secondary Target X-ray Fluorescence Analysis, STXRF, the use of the Kumakhov lens is even more important. A lens can be used between the primary source and the secondary source to increase radiation from the secondary source and, even more important, a lens can be used between the secondary source and the sample. Scanning of the sample can be carried out by either moving the lens and source or moving the sample. The latter is generally preferred so as to retain the analyzed-area-detector geometry.

For many applications it is desirable to average over all or part of the sample. If the lens forms a convergent beam, the analyzed area may be easily adjusted by changing the lens-to-sample spacing and therefore the size of the excited area. By increasing the distance between the lens and the sample, the area of the sample irradiated can be increased. In this case, it is preferable to move the lens rather than the sample in order to retain the sample-detector geometry.

If multiple sources are used at the same or different times, lenses can be used to accurately control the irradiation on the sample, usually to ensure they irradiate the same area.

Positioning a sample so that a chosen area is excited is simplified by allowing another source of electromagnetic radiation to be temporarily positioned where the X-ray source is normally located. It is therefore possible to directly determine the area to be excited. The preferred embodiment is to use a visible light source and view the area directly, but other spectra may be used and observed with the use of instruments.

Figure 5A:
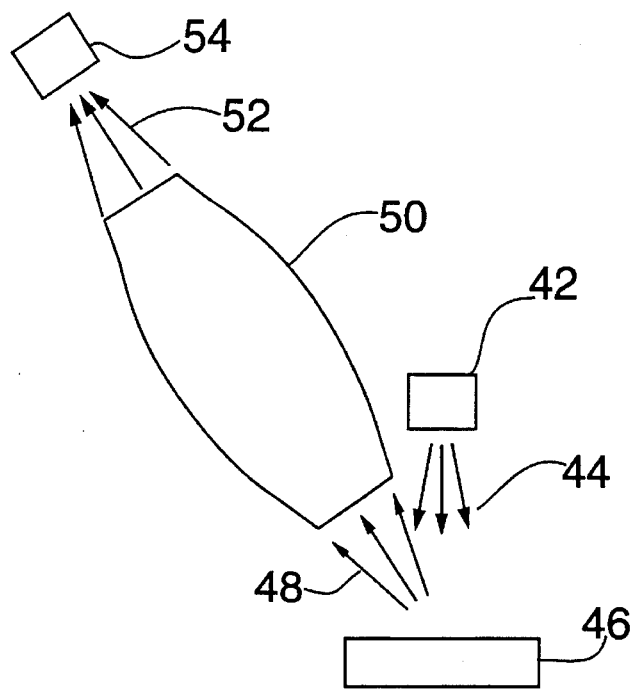
FIG. 5A: A schematic representation of an X-ray source, sample, Kumakhov lens and detector. X-rays travel from the source, to the sample where they are deflected, pass through the Kumakhov lens and are then detected.
Figure 5B:
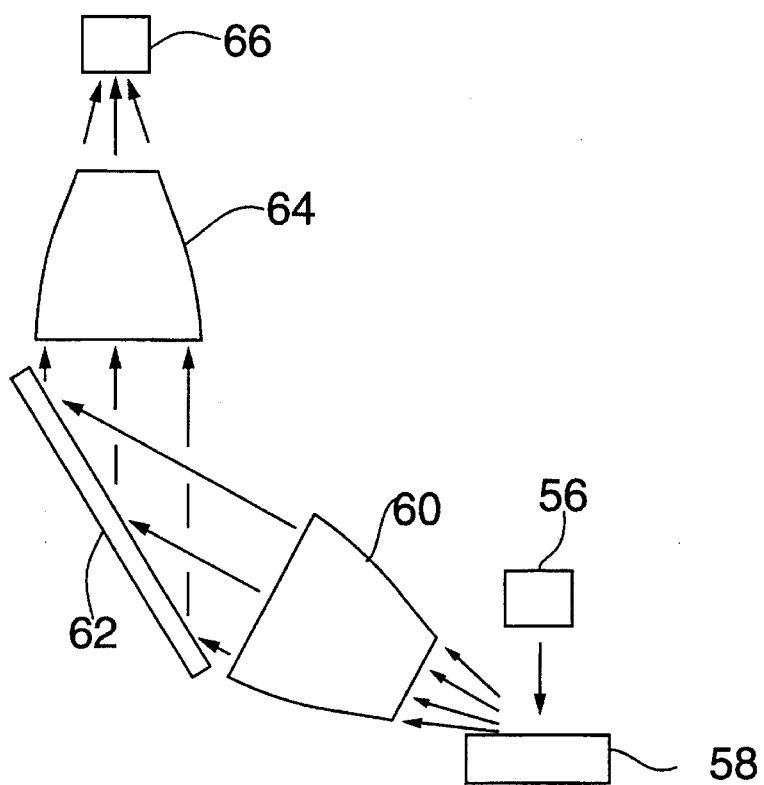
FIG. 5B: A schematic representation of a system having an X-ray source, sample, first Kumakhov lens, crystal, second Kumakhov lens and detector. X-rays travel from the source to the sample where they are deflected through the first Kumakhov lens, to the crystal, through the second Kumakhov lens, and to the detectors.

FIG. 5 shows a lens on the detector side FIG. 5A shows a configuration with the lens 50 between the sample and the detector 54. In the configuration shown, the lens 50 collects X-rays 48 from a selected spot on the sample 46 and focuses the X-rays into a beam 52 incident on the detector 54. The configuration can therefore be used for selected area analysis. This may be done simultaneously with averaging measurements using an EDXRF or WDXRF detector which collects radiation from the entire sample. A Kumakhov lens between the sample and detector can also act as a band-pass filter, designed to cut off radiation at low energy or high energy and may permit the use of a smaller area, and therefore less expensive, or lower capacitance and therefore higher resolution EDS detector (FIG. 5B). In FIG. 5B, an X-ray source 56 irradiates a sample 58. X-rays emitted by the sample 58 are collected by a first Kumakhov lens 60, which directs the beam onto a crystal 62. X-rays from the crystal 62 are collected by a second Kumaknov lens 62, which focuses the X-rays onto a detector 66. For WDXRF, lenses 60, 64 can be used between 58 the sample and crystal 62 and between the crystal 62 and detector 66. These lenses can provide improved collimation without the high absorption losses of the current systems.

FIG. 6A shows lenses 70, 76 on both the source and the detector side of the sample 74. The advantage of a first lens 76 accepting X-rays 82 from the sample 74 on the detector 78 side is realized when used in conjunction with a second lens 70 focusing X-rays 72 onto the sample on the source 68 side. In this case, the volume of the sample measured is defined by the confluence 80 of the object focal spot of the first lens 76 and the image focal spot of the second lens 70 as shown in FIG. 6B. By moving the sample 74, this spot 80 may be positioned, even on the interior of the sample 74. Three dimensional micro-beam X-ray fluorescence analysis then becomes possible. Without Kumakhov lenses, any attempt to improve results requires the use of large sources, large area detectors, and radially oriented collimators. Low photon count rates are of limited use and evolve problems with scattering and secondary emissions. Using Kumakhov lenses, spot size can be as small as 30 microns, and 3 micron spot sizes are obtainable.

A Kumakhov lens has a fairly long focal length and leaves an area of the sample clear for relatively large collection angles. It is therefore possible to combine a variety of measurements in one instrument as shown schematically in FIG. 7. An X-ray source 100 for illuminating a sample 106 with X-rays is connected to a source power supply 102. The sample 106 is positioned by means of a sample positioning system 108 to which the sample is connected. A first Kumakhov lens 104 is positioned between the X-ray source 100 and the sample 106 and oriented to receive X-rays from the X-ray source 100 and direct the X-rays to the sample 106. A second Kumakhov lens 110 is positioned between the sample 106 and an energy dispersive detector 112 and oriented to receive X-rays from the sample and direct the X-rays to the detector 112. A third Kumakhov lens 116 is positioned between the sample 106 and a single crystal or multilayer reflector 118. The third Kumakhov lens 116 is of a compound-curve type and is oriented to receive X-rays from the sample 106 and to direct a quasi-parallel beam of X-rays to the single crystal or multilayer reflector 118. A fourth Kumakhov lens 120 is positioned between the single crystal or multilayer reflector 118 and a wavelength dispersive detector 122. A computer control and analysis system 126 is connected to first and second detector electronic units 114,124 associated respectively with the energy dispersive detector 112 and the wavelength dispersive detector 122. Beyond showing a do-it-all instrument, this figure summarizes the variety of measurements that can be carried out either singly or in combination.

Other, more sophisticated XRF applications using Kumakhov lenses (see, FIG. 8) are envisioned. In this case, the Kumakhov lens 132 produces a quasi-parallel beam from a source 130 which is then Bragg diffracted from a monochromatic crystal 134. The collimated monoenergetic beam is then Bragg diffracted from a single crystal sample 136, and the diffracted beam is either measured directly or collected and concentrated in a second Kumakhov lens 138 and directed onto a detector 140, as shown. Fluorescence radiation produced in the sample is collected and analyzed either directly or through a Kumakhov focusing lens. The configuration shown in FIG. 8 produces X-ray standing waves that can be used in conjunction with measurement of fluorescent X-rays to precisely determine (precise to less than 0.05 angstrom) the position of impurity atoms in the crystal bulk or at crystal surfaces or interfaces or to determine lattice thermal vibration amplitudes and anisotropies. Depending on the diffraction angle from the monochromator crystal, the diffracted X-ray beam may be highly polarized. Use of such a polarized beam may be used in XRF measurements to significantly reduce background and increase sensitivity.

Kumakhov lenses are suitable for very sensitive digital subtraction analysis. By sequentially irradiating the sample area with two different wavelengths of X-rays and subtracting the detected X-ray emissions, background radiation can be eliminated, and very high sensitivity achieved. Obtaining two different wavelengths can be accomplished using a number of methods, including: using two sources, by filtering the X-rays between the source and the sample; by using monochromators to select wavelengths; by using two secondary sources; or by using Kumakhov lenses to obtain tailored band widths. Crystal(s) in the Laue geometry can also be used. Two or more wavelengths can be obtained by using a monochromator with differing angles so as to diffract different wavelengths. Sensitivity is maximized when the two wavelengths used to excite the sample are close and are on either side of the wavelength of the element or compound of interest.

If two different sources are used and the two sources are movable so as to sequentially place the sources in essentially the same position or along the same axis, a single lens between the source location and the sample can be used to increase intensity and ensure excitation of the same sample spot. If two different sources are used and the sources remain in their locations throughout the analysis, then two lenses or a complex lens can be used to increase intensity and ensure excitation of the same sample spot. If a single source is used, two lenses with different bandpass filtering characteristics can be used to obtain two different wavelength spectra for illuminating the sample. If one source is used and Bragg diffraction crystals are used to select wavelengths, use of lenses between the source and crystals may increase intensity, decrease divergence of the beams, and shape the beams, and use of lenses between the crystals and the sample can increase intensity, vary the size of the area of the sample excited, and ensure excitation of the same sample spot. If a single primary source or multiple primary sources are used with two or more secondary sources, lenses between the primary source(s) and the secondary sources can increase intensity and decrease the size of the secondary source spots.

The secondary sources may either be in separate fixed locations or movable and sequentially placed in essentially the same position. Lenses between the secondary sources and the sample can increase intensity, ensure the same sample area is excited, and be used to adjust the size of the sample area excited.

X-Ray Microscope

Prior to the subject invention, the Göttingen X-ray microscope provided best spatial resolution and brightness of any X-ray microscope. It operates on a synchrotron source and uses two Fresnel zone plates. The resolution is about 500Å. In this spot the number of photons reaches about $6\times10^5$ photons/sec (the initial number of photons is about $1.2\times10^{13}$ photons/sec; with losses in the system of approximately $2\times10$.

The Göttingen X-ray microscope is described in: X-ray microscopy, Göttingen, Sept. 14–16, 1963: Edit. S. Schwall, Spring Series in Optical Sciences, Vol. 43. Springer-Verlag, Berlin, Heidelberg, New York, Tokyo, 1984, which is hereby incorporated by reference. Unfortunately, this system is very complex, expensive, has high intensity losses, and requires a parallel beam such as from a synchrotron.

The subject X-ray microscope can be used with an ordinary X-ray source 142, 148, 154, such as, an X-ray tube. In this case, a Kumakhov lens 144, 150, 156 is used after the source, transforming divergent radiation into a quasi-parallel beam. Then, a cone-shaped capillary 146 is used (see, FIG. 9A). If the area of the spot after passing the Kumakhov lens 150 is large, it is possible to emplace there multiple cone-shaped capillaries 152 (see FIG. 9B).

Figure 10:
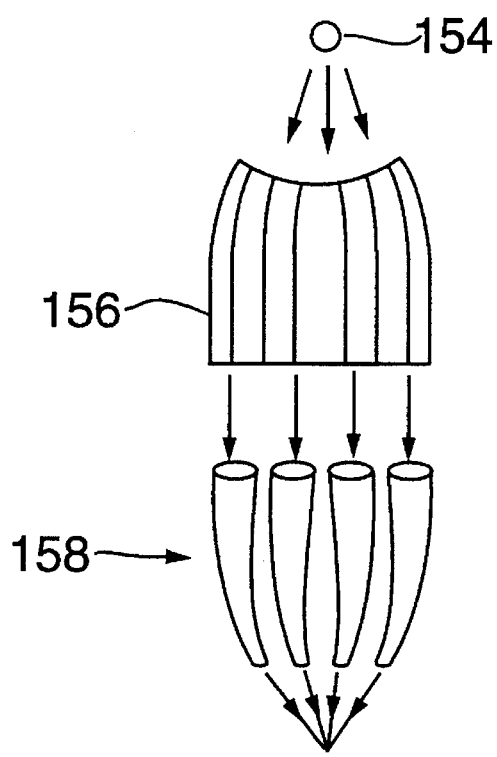
FIG. 10: A schematic representation of a source, Kumakhov lens, and a system of capillaries.

In a certain cases it is worth while to focus the radiation after passing the Kumakhov lens with the help of a system of bent cone-shaped capillaries 158 (see FIG. 10). The capillaries in the device may be kept at a constant cross-section over the distance they are traveling, the capillaries would then be cone-shaped as they approach the focus.

Bremstrahlung, channeled radiation, plasma source, laser plasma, etc. may be used as a radiation source.

Figure 11:
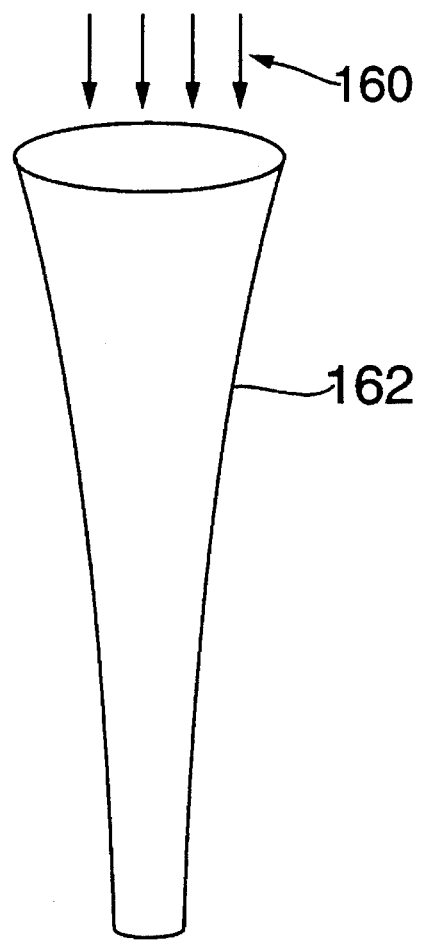
FIG. 11: A schematic representation of a microscope using synchrotron radiation.

If synchrotron radiation 160 (SR) is used as a source, a monochromator may be used for selecting monochromatic radiation, then followed by a cone-shaped capillary 162. In connection with the fact that SR is very intensive, losses on the capillaries' walls may cause overheating of their inner surfaces. The capillaries are heated most of all in the area, where their diameters are minimum. To avoid this, the angle of the cone may be variable. The angle should decrease with the decreasing diameter of the capillary 162 (See FIG. 11). To effectively focus, the angular value of the cone should be smaller than the critical angle of total external reflection (the Fresnel angle). This provides a focusing effectiveness which surpasses the Göttingen X-ray microscope by several orders of magnitude.

When the source 166 has divergent radiation, a Kumakhov lens 164 may be used in which each capillary 168 is bent-barrel-shaped (see FIG. 12). A peculiarity of these capillaries 168 is that the diameters at their ends are much smaller than their diameters in the middle. Meanwhile, the surface of each capillary and of the whole system is formed in such a way that their projection on the plane is a section of a circumference. Radiation travels along the outer surface 172 (see FIG. 13). It is preferred where the diameter of the lens at the exit is equal to its diameter at the entrance. In the ideal construction of such an optical system, the size of the focal spot 170 will near the size of the end of the individual capillaries, which can be smaller than 1 μm. The visualization of the shadow image in the X-ray microscope may be done in the ordinary way, by using X-ray vidicon, or other methods. The first prototype X-ray microscopes have been tested. The physical limit of this X-ray microscope's spatial resolution is limited by diffraction of about 100Å.

The subject X-ray microscope may be used together with other instruments, for example, an energy analyses of electrons knocked off from the surface.

It is also possible to use a divergent source with a Kumakhov lens which forms a parallel beam and then pass the beam through a zone plate to obtain radiation focusing. Such a device achieves very small focal spots since the size of the focal spot is not limited by the size of the capillaries.

Ion Microscope

The schemes shown in FIGS. 9–13 may be used for an ion microscope. The radiation source, naturally, should emit ions. The inner surface of the X-ray optical device and cone-shaped capillaries should be covered with a conductive layer to keep the beam from being blocked because of electrostatic space charge. To make the coefficient of reflection ions from the inner surface maximum, it is necessary to make the capillaries as smooth as possible. This smoothness is more critical for ions than for X-rays. The physical limitation of the spatial resolution of an ion microscope may be at the atomic level, i.e., about 1Å.

As high intensities may be obtained in the focal spot, such a microscope may also be used in different technologies, e.g., for ion implantation, in lithography, etc.

Neutron Microscope

Using a source of neutrons and a material which does not readily absorb neutrons to make the capillaries and/or to cover the inner surface of the capillaries, the systems shown in FIGS. 9–13 may be applied as neutron microscopes.

Electron Microbeam Analysis

Electron microbeam analysis is very similar to X-ray fluorescence except excitation is performed by bombarding with electrons, rather than X-rays. Use of electrons enables a small area to be excited. The subject electron microbeam analysis is similar to the parts of the invention for X-ray fluorescence which apply to use of a Kumakhov lens or lenses between the sample and the detector.

A Kumakhov lens can collect divergent X-rays from the sample and focus the X-rays on the sample. FIG. 5a shows a configuration with the lens 50 between the sample 46 and the detector 54 except for electron microbeam analysis electrons rather than X-rays would be coming from the source 42. In the configuration shown, the lens 50 collects X-rays from a selected spot on the sample and therefore reduces the background due to scattering. A Kumakhov lens 50 between the sample 46 and detector 54 can also act as a band-pass filter, designed to cut off radiation at low energy or high energy, permitting the use of a smaller area, and therefore less expensive, or lower capacitance (higher resolution) energy dispersive detector. For WDXRF, lenses 60, 64 can be used between the sample 58 and crystal 62 and between the crystal 62 and detector 66. These lenses 60, 64 can provide improved collimation without the high absorption losses of the current systems (see, FIG. 5B).

X-Ray Diffraction

X-ray diffraction is a widely used technique that evaluates angular distribution of X-rays coming from the sample. If the sample is other than a single crystal, e.g., a powder sample, a highly parallel beam is needed for irradiating the sample. Under certain conditions, a single crystal sample a convergent beam may be used.

Because angular distribution of the X-rays is being sought, it is not generally useful to use a Kumakhov lens which collects divergent rays from the sample and forms a parallel beam or forms a convergent beam. As shown in FIGS. 14A and 14B, an important benefit is the use of a Kumakhov lens 182, 188 between the source 180, 186 and sample 184, 190 to fashion a beam which is parallel or convergent, as required for the particular analysis of a desired cross-sectional size and shape. Also useful is the ability to selectively filter out undesirable photon energies prior to the X-rays striking the sample by use of lens manufacture combinations, designing the Kumakhov lens channels to be bent in such a shape that they filter out higher energies, using materials which absorb lower energies, or using Kumakhov lenses which provide tailored band widths.

A Kumakhov lens 192 can also be used to collect parallel X-rays from the sample 190 and focus those photons on the detector 194. This configuration is very selective for a narrow angular range of X-rays coming from the sample 190 without the losses inherent in normal collimation and only requiring a small detector 194.

Neutron Diffraction

The same geometries discussed for X-ray diffraction work for neutron diffraction, including filtering to control the energy band width. However, to use Kumakhov lenses for neutrons it is necessary to construct the lenses or coat the lenses with materials which have a very low absorption of neutrons. For example, materials containing boron are unsuitable because of boron's high absorption cross-section for neutrons.

Upon reading the above specification, variations and alternative embodiments will become obvious to one skilled in the art and are to be considered within the scope and spirit of the subject invention. The subject invention is only to be limited by the claims which follow and their equivalents.

What is claimed is:

1. An analytical instrument for analyzing a sample by means of analysis radiation, the analysis radiation being selected from the group consisting of x-ray radiation, gamma-ray radiation, neutron-beam radiation, and ion-beam radiation, the instrument comprising:

(a) a radiation source adapted to produce source analysis radiation, the source analysis radiation selected from the group consisting of x-ray radiation, gamma-ray radiation, neutron-beam radiation, and ion-beam radiation;

(b) sample-positioning means for positioning a sample in a sample-irradiation position for irradiating the sample with analysis radiation from the source analysis radiation produced by the radiation source;

(c) a radiation detector for detecting analysis radiation from the sample, an instrument radiation path being defined from the radiation source to the radiation detector, the sample-irradiation position being located in the radiation path at a position intermediate between the radiation source and the radiation detector; and (d) a multiple-channel, multiple-total-external-reflection lens positioned in the instrument radiation path at a radiation-reorientation position, the multiple-channel, multiple-total-external-reflection lens including at least one polycapillary-bundle element, each polycapillary-bundle element being a substantially unitary structure having a plurality of passageways extending through the polycapillary bundle element in a generally longitudinal direction to define a plurality of capillary-channel passageways, each capillary-channel passageway having substantially smooth inner-surface portions capable of providing total external reflection of analysis radiation incident upon the surface portions at an angle below a critical angle of total external reflection for radiation of the energy of the analysis radiation, each capillary-channel passageway having a longitudinal axis defined extending longitudinally through the capillary channel passageway, each polycapillary-bundle element having an input radiation-capture face and an output radiation-emission face, each capillary-channel passageway of the polycapillary-bundle element opening at a first end through the input radiation-capture face of the polycapillary-bundle element to define a radiation-capture input opening of the passageway, each capillary-channel passageway of the polycapillary-bundle element opening at a second end through the output radiation-emission face of the polycapillary-bundle element to define a radiation-emission output opening of the passageway, each polycapillary-bundle element being shaped so that the longitudinal axis of each of the capillary channel passageways of the element polycapillary bundle extend substantially parallel to a curvilinear path which defines a multiple-reflection total-external-reflection path associated with the passageway, the multiple-reflection total-external-reflection path being defined so that for each capillary-channel passageway analysis radiation incident upon the radiation-capture input opening of the capillary-channel passageway propagating in a direction sufficiently close to the direction of the longitudinal axis of the passageway at the radiation-capture input opening can be channeled through the passageway in a series of reflections by total external reflection from inner wall surfaces of the passageway, the number of such reflections by total external reflection for each passageway being generally greater than two, each polycapillary-bundle element of the multiple-channel, multiple-total-external-reflection lens being shaped to capture at the respective input radiation-capture face, reorient, and emit from the output-emission face analysis radiation so that the multiple-channel, multiple-total-external-reflecting lens captures, reorients, and emits analysis radiation in the radiation path of the analytical instrument.

2. The analytical instrument of claim 1 in which the multiple-channel, multiple-total-external-reflection lens is located in the instrument radiation path at a position intermediate of the radiation source and the sample-irradiation position.

3. The analytical instrument according to claim 2 in which each of the at least one polycapillary-bundle element of the multiple-channel, multiple-total-external-reflection lens is shaped so that the lens is a divergent beam concentrator.

4. The analytical instrument of claim 3 in which the polycapillary-bundle elements of the multiple-channel, multiple-total-external-reflection lens are shaped so that the lens has an input radiation-capture focal point associated with the input radiation-capture faces of the polycapillary-bundle elements of the lens and an output radiation-emission focal point associated with the output radiation-emission faces of the polycapillary-bundle elements of the lens, the lens being positioned and oriented so that the input radiation-capture focal point is located substantially at the position of the radiation source and the output radiation-emission focal point is located substantially at the sample-irradiation position.

5. The analytical instrument according to claim 2 in each of the at least one polycapillary-bundle element of the multiple-channel, multiple-total-external-reflection lens is shaped so that the lens is a quasi-parallel beam former.

6. The analytical instrument according to claim 5 further comprising an analysis-radiation monochrometer, the analysis-radiation monochrometer being positioned in the instrument radiation path at a parallel-beam-illumination location for illumination by a quasi-parallel beam output of the quasi-parallel-beam-former multiple-channel, multiple-total-external-reflection lens.

7. The analytical instrument of claim 1 in which the multiple-channel, multiple-total-external-reflection lens is located in the instrument radiation path at a position intermediate of the sample-irradiation position and the radiation detector.

8. The analytical instrument according to claim 7 in which each of the at least one polycapillary-bundle element of the multiple-channel, multiple-total-external-reflection lens is shaped so that the lens is a divergent beam concentrator.

9. The analytical instrument of claim 8 in which the polycapillary-bundle elements of the multiple-channel, multiple-total-external-reflection lens are shaped so that the lens has an input radiation-capture focal point associated with the input radiation-capture faces of the polycapillary-bundle elements of the lens and an output radiation-emission focal point associated with the output radiation-emission faces of the polycapillary-bundle elements of the lens, the lens being positioned and oriented so that the input radiation-capture focal point is located substantially at the sample-irradiation position and the output radiation-emission focal point is located substantially at the radiation detector.

10. The analytical instrument according to claim 7 in each of the at least one polycapillary-bundle element of the multiple-channel, multiple-total-external-reflection lens is shaped so that the lens is a quasi-parallel beam former.

11. The analytical instrument according to claim 10 further comprising an analysis-radiation monochrometer, the analysis-radiation monochrometer being positioned in the instrument radiation path at a parallel-beam-illumination location for illumination by a quasi-parallel beam output of the quasi-parallel-beam-former multiple-channel, multiple-total-external-reflection lens.

12. An analytical instrument for determining the composition, structure, or other characteristics of a sample in which in operation the sample is irradiated with x rays, gamma rays, neutrons, or a charged particle beam which originate from a primary radiation source, the analytical instrument comprising:

a) a multiple-channel, multiple-total-external reflection x-ray, gamma-ray, neutron, or charged particle beam controller, comprising at least one essentially unitary multiple-hollow-channel element;

b) sample positioning means; and c) radiation detection means;

elements a, b, and c being located in a radiation pathway comprising regions of space which in operation contain primary source radiation or radiation emerging from the sample.

13. The instrument of claim 12, further comprising the primary radiation source.

14. The instrument of claim 12, further comprising radiation monochromating means positioned in the radiation pathway.

15. The instrument of claim 12, wherein the beam controller is positioned in the radiation pathway between the primary radiation source and the sample positioning means.

16. The instrument of claim 15, further comprising radiation monochromating means positioned in the radiation pathway.

17. The instrument of claim 15, further comprising a second multiple-channel, multiple-total-external reflection x-ray, gamma-ray, neutron, or charged particle beam controller, comprising at least one essentially unitary multiple-hollow-channel element positioned in the radiation pathway between the sample positioning means and the radiation detection means.

18. The instrument of claim 17, further comprising radiation monochromating means positioned in the radiation pathway.

19. The instrument of claim 12, wherein the beam controller is positioned in the radiation pathway between the sample positioning means and the radiation detection means.

20. The instrument of claim 19, further comprising radiation monochromating means positioned in the radiation pathway.

21. An analytical instrument for determining the composition, structure, or other characteristics of a sample in which in operation the sample is irradiated with x rays, gamma rays, neutrons, or a charged particle beam which originate in a primary radiation source, the analytical instrument comprising:

a) a secondary source of radiation;

b) a multiple-channel, multiple-total-external reflection x-ray, gamma-ray, neutron, or charged particle beam controller, comprising at least one essentially unitary multiple-hollow-channel element;

c) sample positioning means; and d) radiation detection means;

elements a, b, c, and d being positioned in a radiation pathway comprising volumes of space which in operation contain primary radiation, secondary radiation, or radiation emerging from the sample.

22. The instrument of claim 21, further comprising radiation monochromating means positioned in the radiation pathway.

23. The analytical instrument of claim 21, further comprising a second multiple-channel, multiple-total-external reflection x-ray, gamma-ray, neutron, or charged particle beam controller, comprising at least one essentially unitary multiple-hollow-channel element positioned in the radiation pathway.

24. The instrument of claim 23, further comprising radiation monochromating means positioned in the radiation pathway.

25. The instrument of claim 23, wherein the second beam controller is positioned in the radiation pathway between the secondary source and the sample positioning means.

26. A method for determining the composition, structure, or other characteristics of a sample in which the sample is irradiated with x rays, gamma rays, neutrons, or a charged particle beam, the method comprising the steps of:

a) providing a source of said radiation;

b) directing the radiation produced by the source at a multiple-channel, multiple-total-external reflection x-ray, gamma-ray, neutron, or charged particle beam controller, comprising at least one essentially unitary multiple-hollow-channel element;

c) contacting the sample to be analyzed with the radiation exiting the radiation controller; and d) detecting the radiation emerging from the sample.

27. The method of claim 26, wherein step b further comprises reflecting the radiation exiting the radiation controller, and directing the reflected radiation at a second beam controller.

28. The method of claim 27, wherein the reflecting is accomplished by a crystal.

29. The method of claim 28, wherein the crystal is a single crystal monochromator.

30. The method of claim 26, wherein the radiation emerging from the sample is directed at a second beam controller prior to detection.

* * * * *

EX PARTE REEXAMINATION CERTIFICATE (5317th)

United States Patent
Kumakhov

(10) Number: US 5,497,008 C1
(45) Certificate Issued: Apr. 4, 2006

(54) USE OF A KUMAKHOV LENS IN ANALYTIC INSTRUMENTS

(75) Inventor: Muradin A. Kumakhov, Moscow (SU)

(73) Assignee: X-Ray Optical Systems, Inc., Voorheesville, NY (US)

Reexamination Request:
No. 90/005,778, Jul. 31, 2000

Reexamination Certificate for:
Patent No.: 5,497,008
Issued: Mar. 5, 1996
Appl. No.: 08/383,605
Filed: Feb. 1, 1995

Related U.S. Application Data

(63) Continuation of application No. 08/259,337, filed on Jun. 13, 1994, now abandoned, which is a continuation of application No. 07/678,437, filed on Apr. 1, 1991, now abandoned, which is a continuation-in-part of application No. 07/678,208, filed on Apr. 1, 1991, now Pat. No. 5,192,869, which is a continuation-in-part of application No. 07/607,456, filed on Oct. 31, 1990, now abandoned.

(51) Int. Cl.
*G02B 5/124* (2006.01)

(52) U.S. Cl. .................................. 250/505.1
(58) Field of Classification Search ............. 250/505.1; 378/34, 35; 313/103, 105
See application file for complete search history.

(56) References Cited

U.S. PATENT DOCUMENTS

| | | | | |
|---|---|---|---|---|
| 4,780,903 | A | 10/1988 | Soezima | 378/145 |
| 4,887,282 | A | 12/1989 | Mueller | 378/34 |
| 5,192,869 | A | 3/1993 | Kumakhov | 250/505.1 |

FOREIGN PATENT DOCUMENTS

| | | |
|---|---|---|
| DE | 18 03 806 B | 6/1970 |
| DE | 240 091 A1 | 10/1986 |
| GB | 1 227 929 | 4/1971 |
| GB | 1 474 955 | 5/1977 |
| JP | 42-21460 | 10/1967 |
| JP | 56-067806 | 6/1981 |
| JP | 59-072052 | 4/1984 |
| JP | 5-27840 | 1/1985 |
| JP | 60-033227 | 2/1985 |
| JP | 62-106352 | 5/1987 |
| JP | 7-40080 | 12/1987 |
| JP | 01-185497 | 7/1989 |
| JP | 7-11600 | 1/1990 |
| JP | 02-216100 | 8/1990 |
| RU | 1322888 | 7/1984 |
| RU | 1776149 | 2/1990 |
| RU | 1702811 | 4/1990 |
| SU | 1322888 A1 | 7/1984 |
| SU | 1597009 A1 | 9/1988 |
| SU | 1769623 | 12/1989 |
| WO | WO 88/01428 | 2/1988 |

OTHER PUBLICATIONS

Kolomijtsev et al., Abstract of "Focusing x–ray optical systems for soft radiation", The III All–Union Conference on Radiation of Relativistic Particles in Crystals, May 25–30, 1988, pp. 199–200.

Gubarev et al., Abstract of "Oriented Detector for x–ray radiation", The III All–Union Conference on Radiation of Relativistic Particles in Crystals, May 25–30, 1988, pp. 205–206.

Dr. Waldseth, "X–ray Energy Spectrometry", Kevex Corporation, pp 41–42, 70, 81, 83, 130; 1973.

(Continued)

*Primary Examiner*—Kiet T. Nguyen

(57) ABSTRACT

Analytic instruments using a Kumakhov lens are described. These instruments are useful for X-ray fluorescence analysis or spectroscopy, microscopy, digital subtraction analysis, electron microbeam analysis, X-ray diffraction and neutron diffraction, among others. The analytic instrument provide increased precision and accuracy over instrumentation known in the art. Methods for using these instruments are also taught.

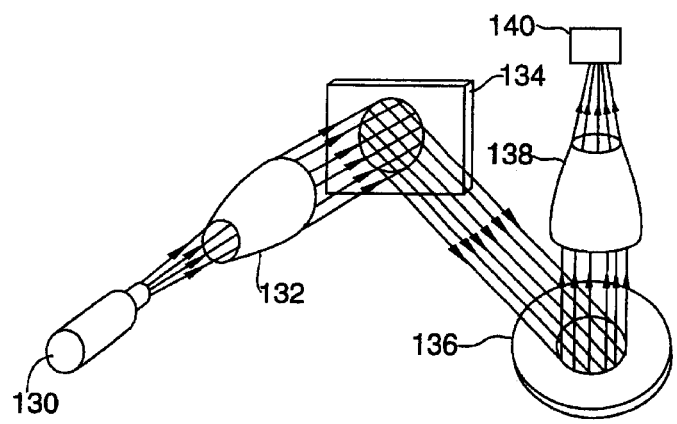

OTHER PUBLICATIONS

Kumakov et al, "Multiple Reflection from Surface X–ray Optics", Physics Reports, vol. 191, No. 5, pp. 291–348 (Aug. 1990) (hereinafter "Multiple Reflection Article").

Arkadiev et al., "Design of a Wide–Pass–Band System for Focusing a Hard X–ray Radiation", Central Research Institute for Scientific Information and Economical Studies on Atomic Science and Technology, pp. 1–45 (1988).

Gubarev et al., "X–Ray Waveguide Quasiparallel Beam Forming Systems", the IV–th Union Conference on Interaction of Radiation with Solids Book of Abstracts, pp. 181 (May 15–19, 1990).

Arkadiev et al., "Wide–Band x–ray Optics with a large angular aperture", Soviet Physics Usp. vol. 32, No. 3, pp. 271–275 (Mar. 1989).

Kovantsev et al. "X–Ray Probe Version of Local X–ray Spectral Method of Analysis", the I.V. Kurchatov Institute of Atomic Energy, pp 1–5, 1991.

Jangobegov et al., "Elemental Base of the X–Ray Guides", the IV–th Union Conference on Interaction of Radiation with Solids Book of Abstracts, pp. 73 (May 15–19, 1990).

Kolomitsev et al., "Point–Source X–ray Lithography with the Use of X–Ray Optical Systems", the IV–th Union Conference on Interaction of Radiation with Solids Book of Abstracts, pp. 88–89 (May 15–19, 1990).

Kumakhov, M.A., "Radiation of Channeled Particles in Crystals", Moskow, Energoatomizdat, p. 35, second paragraph from the bottom, (1986).

Kumakhov, M.A., "Channeling of Photons and New X–Ray Optics", *Nuclear Instruments and Methods In Physics Research, B48,* pp. 283–286, (Mar. 1990).

Kapany, N.S., "Fiber Optics Principles and Applications", *Academic Press Inc.,* pp. 137–138, (1967).

Electronics. Encyclopedic Dictionary. "Soviet Encyclopedy". Moscow, 1990, pp. 254–257.

"The IV–th All–Union Conference on Interaction of Radiation with Solids", *Book of Abstracts,* pp. 1–187 (May 15–19, 1990). Elbrus settlement, Kabardino–Balkarian ASSR, USSR.

*Encyclopedia of Modern Machinery, Automatization of production and industrial electronics,* vol. 3, Moscow, Soviet Encyclopedia, pp. 274–275 (1964–partial translation of pp. 274–275 provided with portion of Russian encyclopedia.

Excerpt from the Book of Abstracts from the "III–rd All–Union Conference on Radiation of Relativistic Particles in Crystals," May 25–30, 1988, in Naltchik, pp. 174–223.

US 5,497,008 C1

1
EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3, 5, 8, 10, 12, 21 and 26 are determined to be patentable as amended.

Claims 2, 4, 6–7, 9, 11, 13–20, 22–25 and 27–30, dependent on an amended claim, are determined to be patentable.

New claims 31–56 are added and determined to be patentable.

1. An analytical instrument for analyzing a sample by means of analysis radiation, the analysis radiation being selected from the group consisting of x-ray radiation, gamma-ray radiation, neutron-beam radiation, and ion-beam radiation, the instrument comprising:
   (a) a radiation source adapted to produce source analysis radiation, the source analysis radiation selected from the group consisting of x-ray radiation, gamma-ray radiation, neutron-beam radiation, and ion-beam radiation;
   (b) sample-positioning means for positioning a sample in a sample-irradiation position for irradiating the sample with analysis radiation from the source analysis radiation produced by the radiation source;
   (c) a radiation detector for detecting analysis radiation from the sample, an instrument radiation path being defined from the radiation source to the radiation detector, the sample-irradiation position being located in the radiation path at a position intermediate between the radiation source and the radiation detector; and
   (d) a multiple-channel, multiple-total-external-reflection lens positioned in the instrument radiation path at a radiation-reorientation position, the multiple-channel, multiple-total-external-reflection lens including [at least one] *a plurality of* polycapillary-bundle element*s*, each polycapillary-bundle element being a substantially unitary structure having a plurality of *hollow* passageways extending through the polycapillary bundle element in a generally longitudinal direction to define a plurality of capillary-channel passageways, each capillary-channel passageway having substantially smooth inner-surface portions capable of providing total external reflection of analysis radiation incident upon the surface portions at an angle below a critical angle of total external reflection for radiation of the energy of the analysis radiation, each capillary-channel passageway having a longitudinal axis defined extending longitudinally through the capillary channel passageway, each polycapillary-bundle element having an input radiation-capture face and an output radiation-emission face, each capillary-channel passageway of the polycapillary-bundle element opening at a first end 2
through the input radiation-capture face of the polycapillary-bundle element to define a radiation-capture input opening of the passageway, each capillary-channel passageway of the polycapillary-bundle element opening at a second end through the output radiation-emission face of the polycapillary-bundle element to define a radiation-emission output opening of the passageway, each polycapillary-bundle element being shaped so that the longitudinal axis of each of the capillary channel passageways of the element polycapillary bundle extend substantially parallel to a curvilinear path which defines a multiple-reflection total-external-reflection path associated with the passageway, the multiple-reflection total-external-reflection path being defined so that for each capillary-channel passageway analysis radiation incident upon the radiation-capture input opening of the capillary-channel passageway propagating in a direction sufficiently close to the direction of the longitudinal axis of the passageway at the radiation-capture input opening can be channeled through the passageway in a series of reflections by total external reflection from inner wall surfaces of the passageway, the number of such reflections by total external reflection for each passageway being generally greater than two, each polycapillary-bundle element of the multiple-channel, multiple-total-external-reflection lens being shaped to capture at the respective input radiation-capture face, reorient, and emit from the output-emission face analysis radiation so that the multiple-channel, multiple-total-external-reflecting lens captures, reorients, and emits analysis radiation in the radiation path of the analytical instrument.

3. The analytical instrument according to claim 2 in which each [of the at least one] polycapillary-bundle element of the multiple-channel, multiple-total-external-reflection lens is shaped so that the lens is a divergent beam concentrator.

5. The analytical instrument according to claim 2 in *which* each [of the at least one] polycapillary-bundle element of the multiple-channel, multiple-total-external-reflection lens is shaped so that the lens is a quasi-parallel beam former.

8. The analytical instrument according to claim 7 in which each [of the at least one] polycapillary-bundle element of the multiple-channel, multiple-total-external-reflection lens is shaped so that the lens is a divergent beam concentrator.

10. The analytical instrument according to claim 7 in *which* each [of the at least one] polycapillary-bundle element of the multiple-channel, multiple-total-external-reflection lens is shaped so that the lens is a quasi-parallel beam former.

12. An analytical instrument for determining the composition, structure, or other characteristics of a sample in which in operation the sample is irradiated with x rays, gamma rays, neutrons, or a charged particle beam which originate from a primary radiation source, the analytical instrument comprising:
   a) a multiple-channel, multiple-total-external reflection x-ray, gamma-ray, neutron, or charged particle beam controller, comprising [at least one] *a plurality of individual capillary-based* essentially unitary multiple-hollow-channel element*s*;
   b) sample positioning means; and
   c) radiation detection means;
elements a, b, and c being located in a radiation pathway comprising regions of space which in operation contain primary source radiation or radiation emerging from the sample.

21. An analytical instrument for determining the composition, structure, or other characteristics of a sample in which in operation the sample is irradiated with x rays, gamma rays, neutrons, or a charged particle beam which originate in a primary radiation source, the analytical instrument comprising:
   a) a secondary source of radiation;
   b) a multiple-channel, multiple-total-external reflection x-ray, gamma-ray, neutron, or charged particle beam controller, comprising [at least one] *a plurality of individual capillary-based* essentially unitary multiple-hollow-channel element*s*;
   c) sample positioning means; and
   d) radiation detection means;
elements a, b, c, and d being positioned in a radiation pathway comprising volumes of space which in operation contain primary radiation, secondary radiation, or radiation emerging from the sample.

26. A method for determining the composition, structure, or other characteristics of a sample in which the sample is irradiated with x rays, gamma rays, neutrons, or a charged particle beam, the method comprising the steps of:
   a) providing a source of said radiation;
   b) directing the radiation produced by the source at a multiple-channel, multiple-total-external reflection x-ray, gamma-ray, neutron, or charged particle beam controller, comprising [at least one] *a plurality of individual capillary-based* essentially unitary multiple-hollow-channel element*s*;
   c) contacting the sample to be analyzed with the radiation exiting the radiation controller; and
   d) detecting the radiation emerging from the sample.

*31. The analytical instrument of claim 1, wherein the polycapillary bundle-elements are rigidly fitted to one another by their external surfaces.*

*32. The analytical instrument of claim 31, wherein channel width is variable along the length of said channels.*

*33. The analytical instrument of claim 1, wherein channel width is variable along the length of said channels.*

*34. The analytical instrument of claim 1, wherein said polycapillary-bundle elements are spatially located with a rigid honeycomb structure formed by the walls of the elements rigidly fitted to one another.*

*35. The analytical instrument of claim 1, wherein said polycapillary-bundle elements are drawn by thermoplastic heating.*

*36. The analytical instrument of claim 12, including a polycapillary bundle-element as at least one of said multiple-hollow-channel elements.*

*37. The analytical instrument of claim 36, wherein said polycapillary bundle-element comprises a plurality of interconnected capillaries.*

*38. The analytical instrument of claim 37, including multiple polycapillary bundle-elements, rigidly fitted to one another by their external surfaces.*

*39. The analytical instrument of claim 37, wherein said multiple-hollow-channel elements are drawn by thermoplastic heating.*

*40. The analytical instrument of claim 36, wherein channel width is variable along the length of said at least one of said multiple channels.*

*41. The analytical instrument of claim 12, wherein channel width is variable along the length of said channels.*

*42. The analytical instrument of claim 12, wherein said multiple-hollow-channel elements are spatially located with a rigid honeycomb structure formed by the walls of the elements rigidly fitted to one another.*

*43. The analytical instrument of claim 21, including a polycapillary bundle-element as at least one of said multiple-hollow-channel elements.*

*44. The analytical instrument of claim 43, wherein said polycapillary bundle-element comprises a plurality of interconnected capillaries.*

*45. The analytical instrument of claim 44, including multiple polycapillary bundle-elements, rigidly fitted to one another by their external surfaces.*

*46. The analytical instrument of claim 44, wherein said multiple-hollow-channel elements are drawn by thermoplastic heating.*

*47. The analytical instrument of claim 43, wherein channel width is variable along the length of said at least one of said multiple channels.*

*48. The analytical instrument of claim 21, wherein channel width is variable along the length of said channels.*

*49. The analytical instrument of claim 21, wherein said multiple-hollow-channel elements are spatially located with a rigid honeycomb structure formed by the walls of the elements rigidly fitted to one another.*

*50. The method of claim 26, wherein at least one of said multiple-hollow-channel elements comprises a polycapillary bundle-element.*

*51. The method of claim 50, wherein said polycapillary bundle-element comprises a plurality of interconnected capillaries.*

*52. The method of claim 51, wherein said polycapillary bundle-elements are rigidly fitted to one another by their external surfaces.*

*53. The method of claim 51, wherein said multiple-hollow-channel elements are drawn by thermoplastic heating.*

*54. The method of claim 50, wherein channel width is variable along the length of said at least one of said multiple channels.*

*55. The method of claim 26, wherein channel width is variable along the length of said channels.*

*56. The method of claim 26, wherein said multiple-hollow-channel elements are spatially located with a rigid honeycomb structure formed by the walls of the elements rigidly fitted to one another.*

* * * * *